(12) United States Patent
Wood et al.

(10) Patent No.: US 12,262,501 B2
(45) Date of Patent: Mar. 25, 2025

(54) LOW PROFILE KEYBOARD, MONITOR AND MOUSE IN RACK

(71) Applicant: Vertiv IT Systems, Inc., Hunstville, AL (US)

(72) Inventors: Christopher Wood, Madison, AL (US); Christopher De Jesus, Huntsville, AL (US)

(73) Assignee: Vertiv Corporationn, Westerville, OH (US)

( * ) Notice: Subject to any disclaimer, the term of this patent is extended or adjusted under 35 U.S.C. 154(b) by 173 days.

(21) Appl. No.: 17/751,922

(22) Filed: May 24, 2022

(65) Prior Publication Data
US 2022/0386499 A1 Dec. 1, 2022

Related U.S. Application Data

(60) Provisional application No. 63/192,787, filed on May 25, 2021.

(51) Int. Cl.
*H05K 7/14* (2006.01)
*H05K 5/02* (2006.01)

(52) U.S. Cl.
CPC ............ *H05K 7/1489* (2013.01); *H05K 5/02* (2013.01); *H05K 7/1487* (2013.01); *H05K 7/1491* (2013.01); *H05K 7/1494* (2013.01)

(58) Field of Classification Search
None
See application file for complete search history.

(56) References Cited

U.S. PATENT DOCUMENTS

| D263,827 | S | 4/1982 | Pemberton |
| D303,956 | S | 10/1989 | Ditzik |
| 5,128,829 | A * | 7/1992 | Loew ............... G06F 1/1626 16/225 |
| 5,388,032 | A * | 2/1995 | Gill ............... A47B 21/0314 361/679.01 |
| D380,738 | S | 7/1997 | McConnell et al. |

(Continued)

FOREIGN PATENT DOCUMENTS

| CN | 207281659 | 4/2018 |
| CN | 208941332 | 6/2019 |

OTHER PUBLICATIONS

JP_3156174_Original_Translation (Year: 2009).*

(Continued)

*Primary Examiner* — Binh B Tran
*Assistant Examiner* — Muhammed Azam
(74) *Attorney, Agent, or Firm* — Suiter Swantz IP

(57) ABSTRACT

A compact keyboard, monitor, and mouse (KMM) system includes a tray subsystem including a pair of drawer slides configured to mate with the equipment rack, each drawer slide having a bottom plane parallel to the ground when installed in the equipment rack. The system further includes a console housing supported by the tray subsystem. The console housing has a top surface that defines recesses for a keyboard and a monitor. The system also includes a keyboard. When secured in the keyboard recess, the keyboard is positioned parallel to the bottom plane of the tray subsystem. When positioned in the monitor recess, the monitor is canted at an angle relative to the bottom plane of the tray subsystem.

17 Claims, 5 Drawing Sheets

(56) References Cited

U.S. PATENT DOCUMENTS

| | | | | |
|---|---|---|---|---|
| 5,742,475 A * | 4/1998 | Riddiford | ............ | G06F 1/1616 403/53 |
| 5,913,034 A * | 6/1999 | Malcolm | ................ | G06F 1/16 709/223 |
| 5,926,364 A * | 7/1999 | Karidis | ................ | G06F 1/1679 361/679.41 |
| 5,949,643 A * | 9/1999 | Batio | ................ | G06F 1/1666 361/679.07 |
| 6,142,590 A | 11/2000 | Harwell | | |
| 6,201,690 B1 * | 3/2001 | Moore | ................ | A47B 81/061 361/679.21 |
| 6,353,532 B1 | 3/2002 | Landrum | | |
| 6,442,030 B1 * | 8/2002 | Mammoser | ............ | G06F 1/181 248/917 |
| 6,563,700 B1 * | 5/2003 | Waller | ................ | H05K 7/1494 361/679.09 |
| 6,609,034 B1 * | 8/2003 | Behrens | ................ | G06F 3/023 700/20 |
| 6,856,505 B1 * | 2/2005 | Venegas | ................ | G06F 1/183 361/679.05 |
| 6,945,412 B2 | 9/2005 | Felcman et al. | | |
| 7,019,963 B2 * | 3/2006 | Lee | ............ | G06F 1/16 361/679.06 |
| 7,187,554 B2 | 3/2007 | Seki et al. | | |
| 7,256,986 B2 * | 8/2007 | Williams | ................ | G06F 1/16 248/222.12 |
| 7,405,926 B2 * | 7/2008 | Wu | ............ | G06F 1/16 312/334.4 |
| 7,414,853 B2 * | 8/2008 | Lee | ................ | G06F 3/0227 361/726 |
| 7,624,281 B2 * | 11/2009 | Mehta | ................ | G06F 3/023 713/153 |
| 7,633,760 B2 * | 12/2009 | Wu | ............ | G06F 1/182 384/19 |
| 7,675,742 B2 * | 3/2010 | Wu | ............ | G06F 1/16 345/169 |
| 7,725,988 B2 * | 6/2010 | Kim | ................ | G06F 1/1624 16/361 |
| 7,869,201 B2 * | 1/2011 | McCoy | ................ | G06F 1/1632 345/169 |
| 8,848,376 B2 * | 9/2014 | Lee | ................ | G06F 1/1679 248/205.2 |
| 8,922,981 B2 * | 12/2014 | Leigh | ................ | G06F 1/1601 361/679.01 |
| 8,950,593 B2 * | 2/2015 | Chen | ................ | H05K 7/1489 312/334.1 |
| 8,995,125 B2 * | 3/2015 | Matsuoka | ............ | G06F 1/1658 361/679.55 |
| 9,442,513 B2 * | 9/2016 | Ecker | ................ | H05K 7/16 |
| 9,823,717 B2 * | 11/2017 | Lin | ............ | G06F 1/203 |
| 9,861,004 B2 * | 1/2018 | Anderson | ............ | H05K 7/1489 |
| D886,104 S | 6/2020 | Wu | | |
| 10,798,844 B2 * | 10/2020 | Lee | ................ | H05K 5/0221 |
| 10,827,643 B2 * | 11/2020 | Sassano | ................ | H05K 7/183 |
| 11,477,895 B2 * | 10/2022 | Wood | ................ | G06F 1/1656 |
| 2003/0106863 A1 * | 6/2003 | Lauchner | ............ | H05K 7/1489 312/334.8 |
| 2005/0035262 A1 * | 2/2005 | Seki | ................ | H05K 7/1494 248/441.1 |
| 2006/0232578 A1 * | 10/2006 | Reinhorn | ............ | G06F 1/1624 345/211 |
| 2006/0232917 A1 * | 10/2006 | Wu | ................ | H05K 7/1494 361/679.01 |
| 2006/0262496 A1 * | 11/2006 | Lee | ................ | G06F 1/1681 361/679.27 |
| 2006/0289370 A1 * | 12/2006 | Shih | ................ | H05K 7/1494 211/26 |
| 2007/0058329 A1 * | 3/2007 | Ledbetter | ............ | G06F 1/1677 361/679.06 |
| 2007/0121302 A1 * | 5/2007 | Lee | ................ | G06F 1/183 361/726 |
| 2008/0123284 A1 * | 5/2008 | Jaramillo | ................ | G06F 1/181 361/679.1 |
| 2008/0204982 A1 | 8/2008 | Wu | | |
| 2009/0219701 A1 * | 9/2009 | Wu | ................ | H05K 7/1494 361/727 |
| 2009/0222670 A1 * | 9/2009 | Mehta | ................ | G06F 21/32 713/186 |
| 2010/0053873 A1 * | 3/2010 | Cheng | ................ | H05K 7/1494 361/679.15 |
| 2010/0057842 A1 * | 3/2010 | Priller | ................ | G06F 1/183 710/316 |
| 2010/0177045 A1 * | 7/2010 | Lu | ................ | G06F 3/0202 345/168 |
| 2010/0277858 A1 * | 11/2010 | Zhou | ................ | G06F 1/1669 361/679.17 |
| 2010/0328872 A1 * | 12/2010 | Chou | ................ | H05K 7/1494 248/220.21 |
| 2011/0023272 A1 * | 2/2011 | Huang | ................ | E05D 11/087 16/362 |
| 2011/0194237 A1 * | 8/2011 | Weng | ................ | G06F 1/1616 361/679.08 |
| 2012/0050974 A1 * | 3/2012 | Chen | ................ | H05K 7/1494 361/679.21 |
| 2012/0224314 A1 * | 9/2012 | Hinshaw | ............ | G06F 1/1639 361/679.01 |
| 2013/0068706 A1 * | 3/2013 | Chen | ................ | H05K 7/1494 248/274.1 |
| 2013/0257733 A1 * | 10/2013 | Moore | ................ | G06F 1/1618 345/168 |
| 2014/0293527 A1 * | 10/2014 | Gambon | ............ | H05K 5/0247 361/679.21 |
| 2017/0127554 A1 * | 5/2017 | Iizuka | ................ | H05K 7/1491 |
| 2017/0164506 A1 * | 6/2017 | Anderson | ............ | G06F 1/181 |
| 2017/0235329 A1 * | 8/2017 | Ecker | ................ | G06F 1/1601 361/679.2 |
| 2017/0332509 A1 * | 11/2017 | Miyatsu | ................ | G06F 1/186 |
| 2018/0324972 A1 * | 11/2018 | Miyatsu | ................ | H05K 7/183 |
| 2019/0246510 A1 * | 8/2019 | Wood | ................ | H05K 5/0204 |
| 2020/0100384 A1 * | 3/2020 | Sassano | ................ | H05K 7/183 |
| 2022/0386499 A1 * | 12/2022 | Wood | ................ | H05K 7/1494 |

OTHER PUBLICATIONS

International Search Report and Written Opinion for International Application No. PCT/US2022/030724 mailed Sep. 8, 2022.

* cited by examiner

LOW PROFILE KEYBOARD, MONITOR AND MOUSE IN RACK

CROSS REFERENCE TO RELATED APPLICATION

The present application claims priority from U.S. provisional application Ser. No. 63/192,787, filed May 25, 2021, the disclosure of which is hereby incorporated by reference into the present disclosure.

FIELD OF THE INVENTION

The present disclosure relates to keyboard, monitor, and mouse systems, and more particularly to a low profile keyboard, monitor and mouse console for providing a user interface to a computing component.

BACKGROUND OF THE INVENTION

The statements in this section merely provide background information related to the present disclosure and may not constitute prior art.

A Keyboard-Monitor-Mouse ("KMM") system is a console-like system that allows a user to access, view, and interact with a target device such as a server, computer, or networked device. Typically, the conventional KMM system is mounted in a standard equipment rack along with the device (e.g., server) that it is communicating with.

Typical KMM systems utilize a "clamshell" configuration, similar in form to a standard laptop. Like a standard laptop, the display portion of the system is mounted on a hinge. When in a "deployed" position, the display portion is positioned vertically such that the keyboard and mouse are accessible to a user and the display portion is viewable by the user. When in a "stowed" position, the display portion is rotated such that the display portion becomes positioned horizontally and is stacked on top of the keyboard. Accordingly, the combined thickness of the hinge mechanism, display portion, and the keyboard contribute to the overall height of the KMM system. One example of such a "clamshell" KMM is U.S. Patent Application No. 2019/0246510, filed Feb. 5, 2018, by Applicant, the contents of which are hereby incorporated herein by reference in their entirety. Some other types of KMM systems have a permanently fixed, vertically mounted display portion that is separate from the mouse and keyboard. In such KMM systems, the largest physical dimension of the display contributes to the overall height of the KMM system.

While KMM systems are necessary for the operation of data centers, the aforementioned configurations take up space that could otherwise be used by servers that contribute to the effectiveness (i.e. revenue generation and computing power of a data center. In particular, the introduction and widespread adoption of hyper-converged computing as well as collocated data centers putting a premium on space in their facilities have contributed to the need for more servers for a given rack and thus lower profile and more compact KMM systems. However, KMM systems are only available in configurations that have a larger overall height and thus take up, block access to, or inhibit, the optimal configuration of a significant number of valuable rack spaces. Moreover, previous KMM systems are relatively heavy and awkward to install into, and remove from, a computer equipment rack.

Accordingly, there is a need for a solution to at least one of the aforementioned problems. For example, there is an established need for a low profile KMM system with minimal overall height. For another example, there is an established need for KMM systems with fixed displays that prevent the display from interfering with rack spaces adjacent to the KMM system. There is also an established need for a reduction in the number of steps required for a user to deploy KMM systems in order to provide the user with faster access to the attached appliances.

SUMMARY OF THE INVENTION

This section provides a general summary of the disclosure and is not a comprehensive disclosure of its full scope or all of its features.

The present invention is directed to a compact keyboard, monitor, and mouse (KMM) system for use in an equipment rack. The system includes a tray subsystem having a bottom plane. The system further includes a console housing supported by the tray subsystem, the console housing including a top surface that defines a monitor recess. A monitor is fixedly supported on the monitor recess. The monitor is positioned at an angle relative to the bottom plane of the tray subsystem so as to be viewable for use by a user.

Alternative embodiments are contemplated in which the tray subsystem further includes a pair of drawer slides configured to mate with the equipment rack. The bottom plane of the tray subsystem is parallel to the ground when installed in the equipment rack. In other embodiments, the angle of the monitor is selected to minimize the overall height of the KMM system while maximizing the angle or also optimizing the viewing angle of the monitor for use by the user. In other embodiments the angle of the monitor is about 3.5 degrees. In other embodiments the system further includes a keyboard positioned parallel to the bottom plane and removably secured to the console housing with a keyboard recess defined on the top surface of the console housing. In other embodiments, the system further includes a keyboard positioned parallel to the monitor and removably secured to the console housing within a keyboard recess defined on the top surface of the console housing. In other embodiments, the tray system can further include a pair of drawer slides configured to mate with the equipment rack, and the bottom plane of the tray subsystem is positioned at the same angle as the monitor relative to the ground when installed in the equipment rack. In other embodiments the tray subsystem can further include a pair of drawer slides configured to mate with the equipment rack, the drawer slides moveable between a first position, presenting the console housing to a user, and to a second position for storage within the equipment rack.

The present invention is also directed to a compact keyboard, monitor, and mouse (KMM) system for use in an equipment rack. The system includes a tray subsystem which includes a pair of drawer slides that are configured to mate with the equipment rack, where each drawer slide has a bottom plane that is parallel to the ground when installed in the equipment rack. The system further includes a console housing that is supported by the tray subsystem. The console housing has a top surface, where the top surface defines a keyboard recess and a monitor recess. The system also includes a keyboard. When the keyboard is secured in the keyboard recess, the keyboard is positioned parallel to the bottom plane of the tray subsystem. The monitor when positioned in the monitor recess is canted at an angle relative to the bottom plane of the tray subsystem. The angle is selected to minimize the overall height of the KMM system while maximizing user ergonomics or also optimizing user ergonomics and the viewing angle of the monitor screen.

Alternative embodiments are contemplated in which the console housing includes a plurality of connectors 12 along a lower rear edge portion. The connectors can be a USB port, a DVI video connector, a VGA video connector, a Display Port, or an AC power connector port. In other embodiments, the system further includes a cable management system secured to the tray subsystem for supporting cabling. The cabling is designed to be coupled to the console housing.

The present invention is also directed to a computer rack assembly including an equipment rack having a horizontal plane that is parallel to the ground. The system has a tray subsystem that includes a pair of drawer slides that are mated to the equipment rack. The system also has a console housing that is supported by the tray subsystem where the console housing has a top surface. The top surface defines a keyboard recess and a monitor recess. The system also has a keyboard. The keyboard is secured to the console housing within the keyboard recess. The keyboard is positioned parallel to the bottom plane of the tray subsystem. The system also has a monitor. The monitor is fixedly supported on the monitor recess so as to be viewable for use by a user. The monitor is positioned at an angle relative to the bottom plane of the tray subsystem. The angle is selected to minimize the overall height of the KMM system while maximizing user ergonomics.

Alternative embodiments are contemplated in which the console housing is removable from the tray subsystem as a single assembly. In other embodiments, the top surface of the console housing is positioned at a second angle different from the angle of the monitor and parallel to the ground. In other embodiments, the keyboard is positioned parallel to the ground. In other embodiments the system further includes at least one computer server mated to the equipment rack.

These and other objects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which.

Like reference numerals refer to like parts throughout the several views of the drawings.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Shown throughout the figures, the present invention is directed towards a low profile keyboard, monitor, and mouse system ("KMM"). Referring initially to FIGS. 1-4, one embodiment of a KMM system is depicted in accordance with an exemplary embodiment of the present invention.

Figure 1:
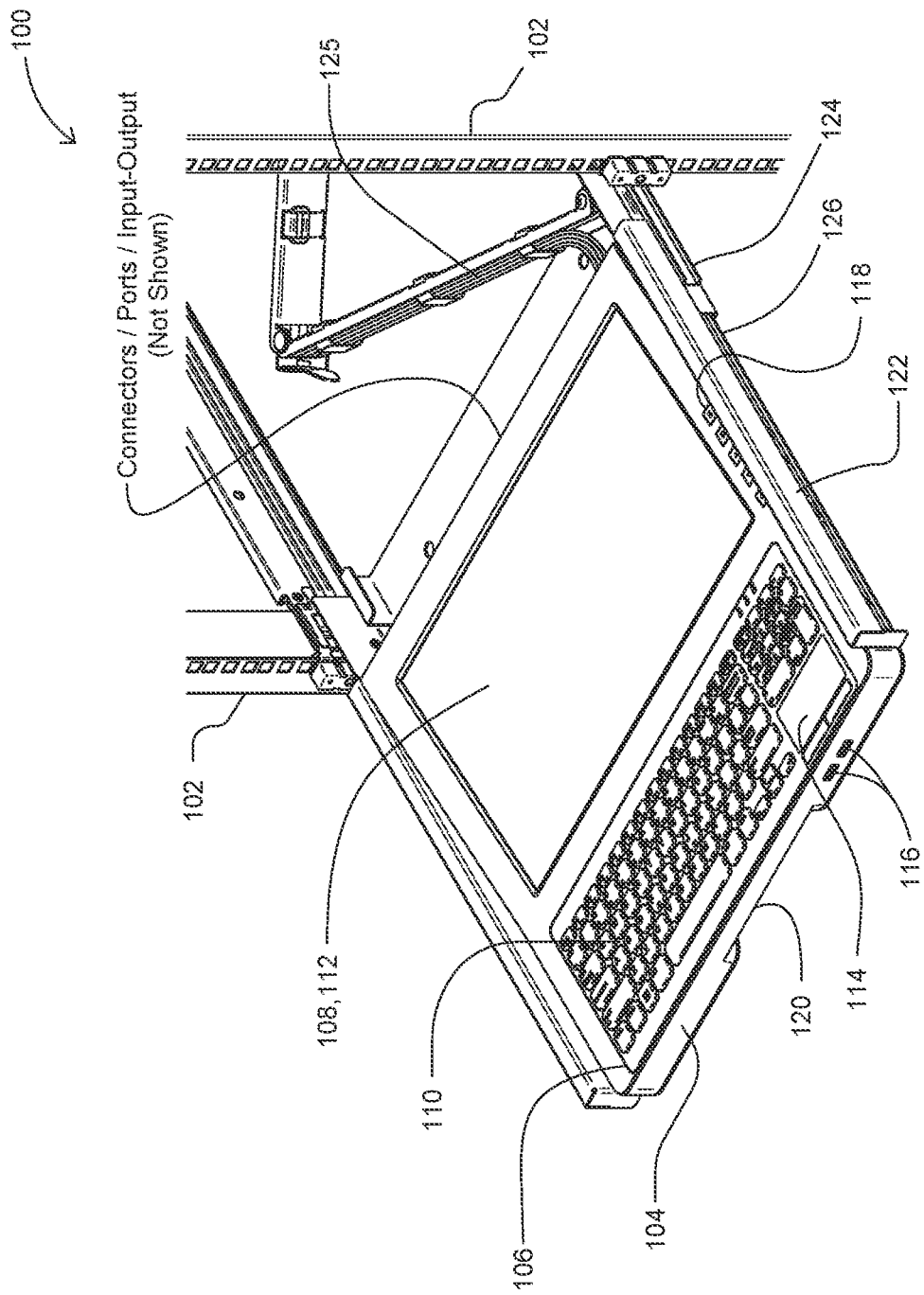
FIG. 1 is a perspective view of a KMM system in a deployed position in accordance with the present disclosure.

FIG. 1 depicts a perspective view of a KMM system 100. KMM system 100 can be a compact, low profile keyboard, monitor, mouse system and may be installed in a standard server equipment rack 102. For example, equipment rack 102 can be a 19 inch (48.26 cm) EIA compliant rack cabinet system (also known as a server rack). Moreover, KMM 100 can have an overall height of about 1.75 inches (44.5 mm) or less and an overall width of about 19 inches (48.26 cm) or less. These dimensions correspond to the dimensions of a single "U" space in equipment rack 102.

One component of the KMM system 100 is a console housing 104. The console housing 104 can have an overall depth of 18 inches (457 mm). This depth of the console housing 104 can define a space in the rear of KMM system 100. In some embodiments, the space could accommodate additional rack mounted devices that can either be separate from or support the operation of the KMM system 100. The upper surface of the console housing 104 defines a keyboard section 106 and a monitor section 108. One or both of the keyboard and monitor sections 106 and 108 can further define a respective recess. For example, in some embodiments a keyboard recess in keyboard section 106 can follow the contour of a keyboard 110. As depicted, the keyboard 110 can have a contour generally in the form of a rectangle with rounded corners. The contour of keyboard 110 is in turn followed by the recess defined by keyboard section 106. It is contemplated that the keyboard recess at keyboard section 106 can follow the contour of any keyboard 110 so long as the gap between edge of the keyboard 110 and the top surface of the console housing 104 is minimized. In some embodiments, the monitor section 108 can likewise follow the contour of a monitor 112. The keyboard 110 as depicted includes a standard ANSI input key layout and a trackpad 114. The keyboard 110 can have any type of keyboard input layout. The trackpad 114 can be a touch sensitive pad, a trackpad, a primary or secondary visual touchscreen, or any other interactive type surface that facilitates user interaction with the KMM system 100. As depicted, keyboard 110 is removable, however the keyboard 110 may also be permanently integrated into the console housing 104. The monitor 112 as depicted is integrated into the console housing 104 but may also be removable. The monitor 112 is also depicted as an LCD monitor. However, the monitor 112 can also be a touchscreen or any display type that facilitates user interaction with a target device.

The console housing 104 may internally house any power supply or power distribution component that is required to power its internal components, as well as the monitor 112 and the keyboard 110, and also any components that serve to enable communications between the monitor 112 and keyboard 110 and a target device (e.g., target server). For example, such components may include, but are not limited to, a video controller PCBA, a Power Supply, a video and data connector PCBA, a user control panel, and power distribution subassembly or PCBA, as well as audio input and/or output connectors. The console housing 104 in this example can be seen to include various communications ports 116. The specific style of connector(s) for ports 116 may be USB-A, USB-B, USB-Micro, USB-Mini, USB-C, Thunderbolt, RS-232, or virtually any other style of connection which is suitable for connecting a peripheral to a target system. The ports 116 are also located on the front edge of the console housing 104 so as to be accessible to a user when the KMM 100 is in the stowed position. The console housing in this example can also be seen to include various switches 118. The switches 118 can be selectors, controls, power switches, sensors (i.e. motion, touch or capacitive sensors) or other types of switches. The switches 118 can allow the user the ability to customize, configure, or control the functions and setup of the KMM system 100.

KMM 100 can, by the actions of a user, selectively and reversibly adopt a stowed and a deployed position. KMM 100 is depicted in FIG. 1 in a deployed position and in FIGS. 2-3 in a stowed position. When the KMM 100 is in the stowed position, the ports 116 are still accessible by a user. In addition, when the KMM 100 is in the stowed position the front door of rack 102 may be closed (not shown). Also, when the KMM 100 is in a stowed position, a user may grasp a handle 120 and pull in order to place the KMM 100 in a deployed position. When the KMM 100 is in a deployed position, a user may push on the front surface of the console housing 104 to place the KMM 100 in a stowed position. This functionality is enabled by a tray subsystem 122 which can support the console housing 104. The tray subsystem 122 includes a pair of drawer slides 124. In addition, the drawer slides 124 can include a number of detents (not shown) in order to secure the KMM 100 in a deployed (as shown in FIG. 1), stowed (as shown in FIGS. 3 and 4), or intermediate position. The tray subsystem 122 can include a lower tray portion and thus resemble a standard household drawer. However, in order to minimize an overall height, the tray subsystem 122 as depicted in FIG. 1 does not have a lower tray portion. The console housing 104 can be secured to the pair of drawer slides 124 via a number of fasteners (not shown). For example, the console housing 104 can further include an integrated structural frame that engages directly with the drawer slides 124. The console housing 104 can also be latched to the drawer slides 124 at the rear and secured with fasteners to the drawer slides 124 in the front. The fasteners in the front can be located within the keyboard recess at the keyboard section 106. The drawer slides 124 may be engaged with mating slides mounted in the equipment rack 102 at the U space where the KMM system 100 is to be located. Tray subsystem 122 also includes a cable management system 125 which moves with the KMM 100 when the KMM 100 is moved between stowed and deployed positions. The cable management system 125 allows quick and easy connection of all relevant ports contained within the console housing 104 to the individual cables. For example, AC ports, USB ports, DVI ports, VGA ports, or Display Port (DP) ports disposed in the rear of the console housing (as shown in FIG. 5) can connect to respective AC power cables, USB cables, DVI, VGA, or Display Port (DP) cables, audio connectors, or any cables necessary for communications between the KMM 100 and a target server or remote server. The inclusion of such ports enables quick and easy interfacing of the KMM 100 with a target server. In some embodiments the target server can be located in the same equipment rack 102 as the KMM system 100. However, the KMM system 100 may be mounted in the parallel U space of another equipment rack directly behind or adjacent to the KMM system 100. Moreover, the KMM system 100 may be mounted in any U space where the cables may be conveniently routed towards the target device, such as a KVM switch or a network switch. While the target device may be located in close proximity to the KMM 100, the KMM 100, in targeting a networked KVM switch or other type of network switch, may access any target device within or without the facility where the KMM 100 is located.

Figure 2:
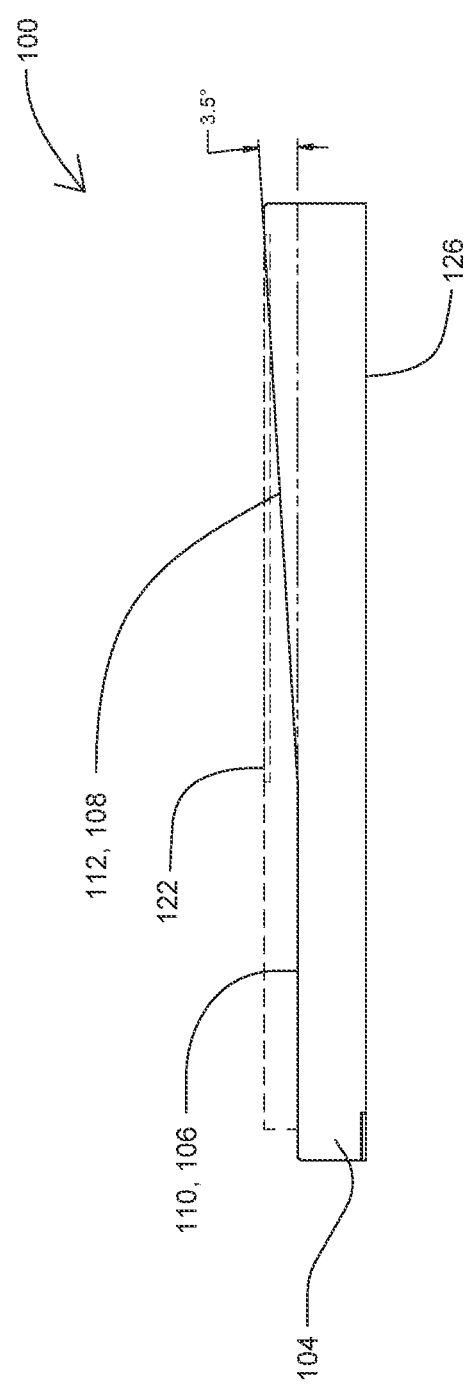
FIG. 2 is a side view of the KMM system of FIG. 1.
Figure 3:
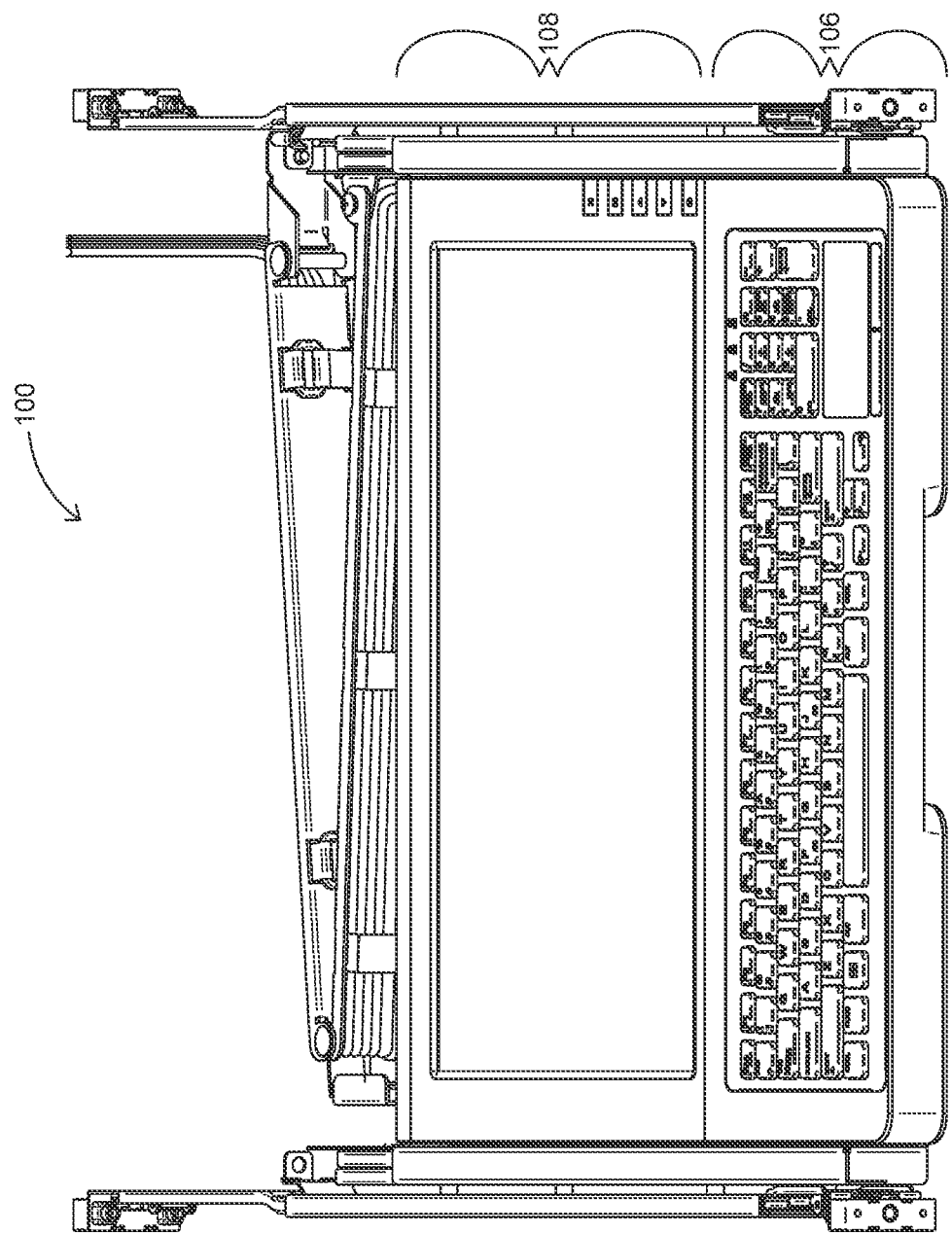
FIG. 3 is a top perspective view of the KMM system of FIG. 1 in a stowed position.
Figure 4:
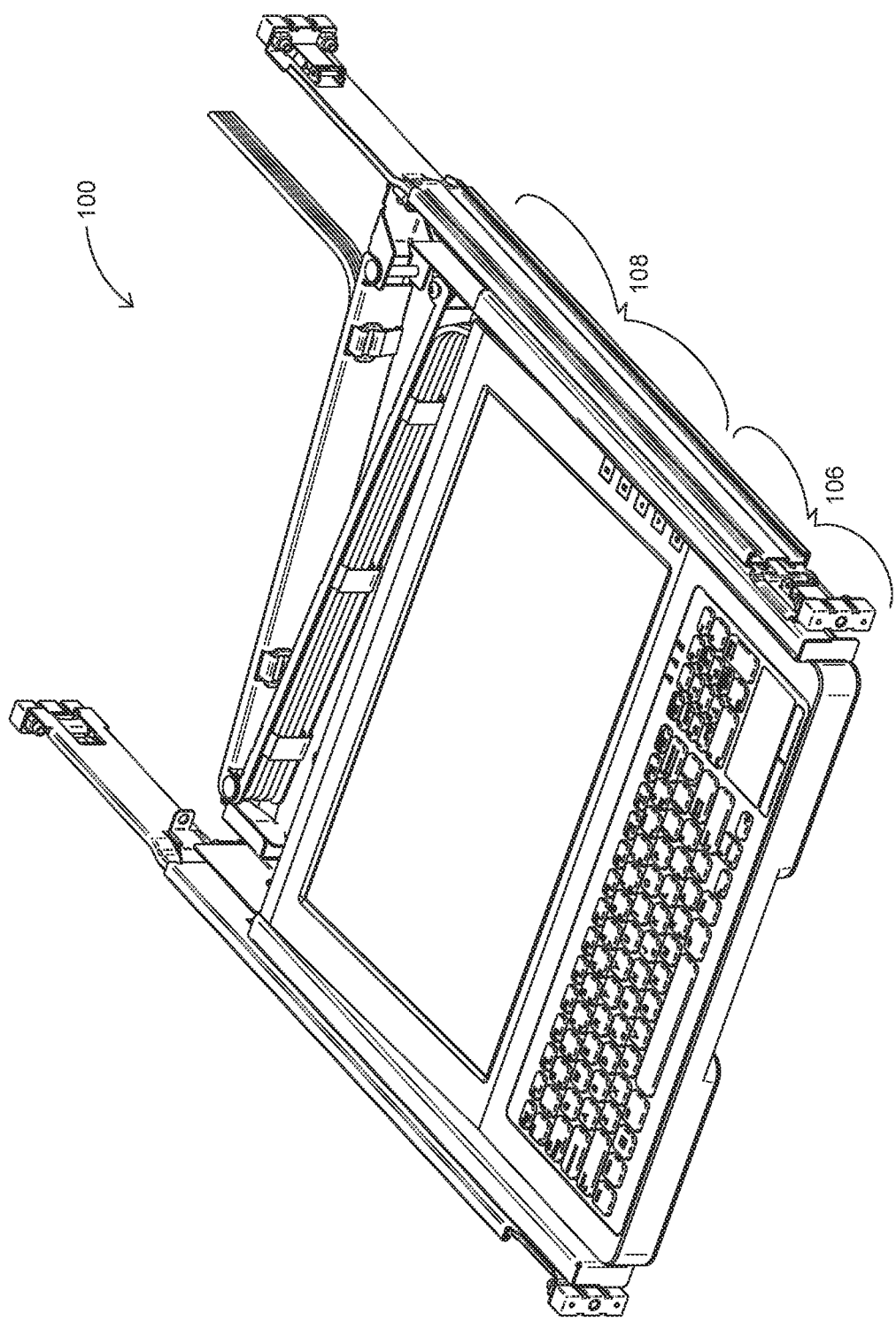
FIG. 4 is a perspective view of the KMM system of FIG. 3, also in a stowed position.
Figure 5:
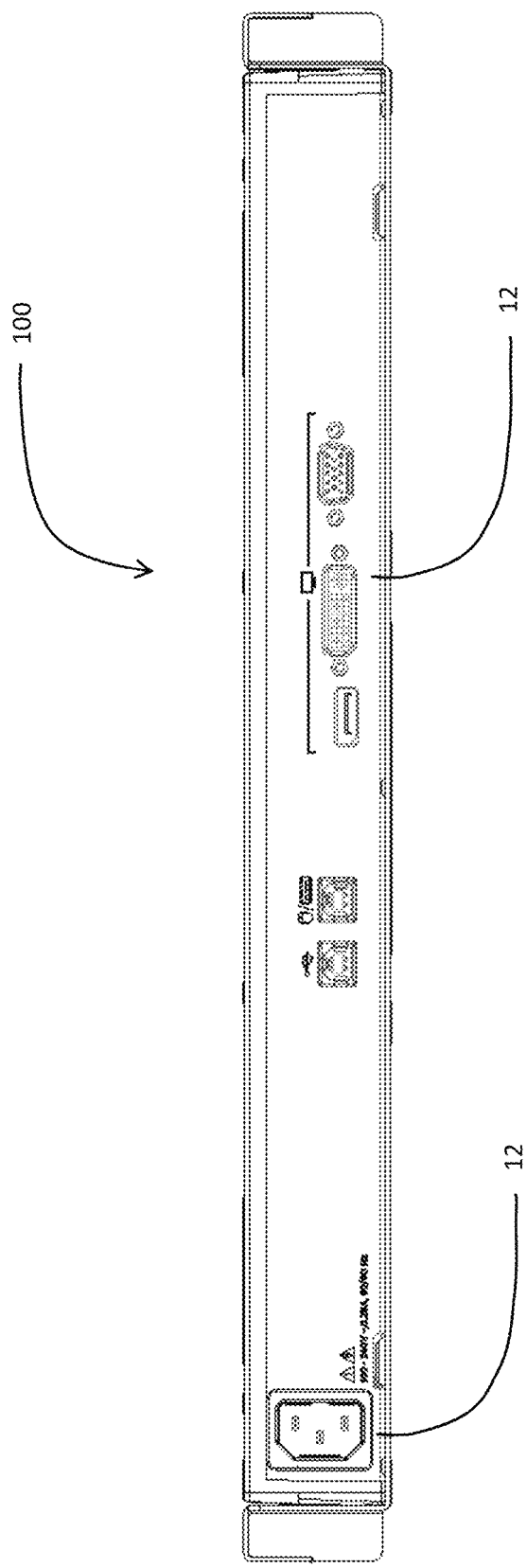
FIG. 5 is an example rear view of a console housing depicting a plurality of connectors of the KMM system of FIG. 1.

FIGS. 1-4 depict but FIG. 2 most clearly shows KMM 100 presenting the monitor 112 at an angle. This angle can be in relation to the angle relative to the ground when KMM 100 is mounted in rack 102. However, the angle in this case can be more clearly defined in the following relationship. The tray subsystem 122 can define a bottom plane 126. In some embodiments the bottom plane 126 can be the bottom of tray subsystem 122 and thus resemble a standard kitchen drawer. When the KMM 100 is mounted in rack 102, the bottom plane 126 is generally parallel to the ground. As depicted, the monitor 112 is mounted at a fixed angle of 3.5° (degrees) relative to the bottom plane 126. The angle of 3.5° was selected to balance the overall height of KMM 100 with ergonomics for the user. As depicted, the keyboard 110 is at a fixed angle of 0° (degrees) relative to the bottom plane 126. The angle of 0° was selected to maximize the angle of the monitor 112. It should be readily apparent that monitor 112 may be fixedly positioned at any angle that allows the KMM system 100 fit into a single U space or less. For example, in some embodiments the console housing 104 could be designed with the monitor 112 permanently fixed at any angle from 0° through 10°. In other embodiments the KMM 100 may include a mechanism that would allow the monitor 112 to be adjusted to any angle so long as the mechanism does not increase the overall height of KMM 100 to about or more than a single U height. Additionally, it should be readily apparent that the omission of the monitor 112 adjustment mechanism facilitates minimizing the overall height of KMM 100.

As depicted in FIG. 3 the angle of monitor 112 is defined by the structure of the monitor section 108. FIG. 3 further depicts keyboard 110 at an angle likewise defined by the structure of the keyboard section 106. However, in other embodiments, the monitor and keyboard sections 106 and 108 form a single flat surface. The angle of the monitor 112 and the keyboard 110 could then be defined by the overall angle of the console housing 104. For example, the front of the console housing 104 can be attached to the drawer slides 124 at a relatively lower elevation to the rear attachment of the console housing 104 to the drawer slides 124. This difference in elevation can cause the monitor 112 and the keyboard 110 to be presented to a user at a fixed angle of 3.5° when the KMM 100 is in its deployed position.

As will be readily apparent KMM 100 may be installed in any rack 102 such as in data centers, server rooms, and telecom infrastructure. However, the KMM 100 may be installed in any application in which a user needs to access or interact with a target device. A target device can be any device that requires user control. The target device may or may not have a keyboard, mouse or other terminal component. KMM 100 may be installed in custom or specialized fixtures such as closets, mobile environments, work stations, studios, and the like.

Alternative embodiments are contemplated in which the KMM occupies U space of less than 1 U. Further embodiments are contemplated in which the KMM occupies one-half a U of space. More embodiments are contemplated in which the monitor is canted 0° (degrees) and thus minimizes the overall height with little consideration to ergonomics. Still more embodiments are contemplated in which keyboard is omitted from the KMM and the monitor is a single large touchscreen.

Since many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. A compact keyboard, monitor, and mouse (KMM) system for use in an equipment rack, the KMM system comprising:
   a tray subsystem having a bottom plane;
   a console housing supported by the tray subsystem, said console housing comprising a top surface that defines a monitor recess and a keyboard recess;
   a monitor fixedly supported on and positioned at an incline in the monitor recess relative to the bottom plane of the tray subsystem, the monitor viewable for use by a user;
   a keyboard positioned parallel to the bottom plane and removably secured within the keyboard recess.

2. The KMM system of claim 1, wherein the tray subsystem further comprises a pair of drawer slides configured to mate with the equipment rack; and the bottom plane of the tray subsystem is parallel to ground when installed in the equipment rack.

3. The KMM system of claim 1, wherein an angle of the incline monitor is selected to minimize an overall height of the KMM system while maximizing the angle of the incline.

4. The KMM system of claim 3, wherein the angle of the incline monitor is 3.5 degrees.

5. The KMM system of claim 1, wherein the keyboard is positioned parallel to the monitor.

6. The KMM system of claim 1, wherein the tray subsystem further comprises a pair of drawer slides configured to mate with the equipment rack; the pair of drawer slides movable between a first position, presenting the console housing to the user, and to a second position for storage within the equipment rack.

7. A compact keyboard, monitor, and mouse (KMM) system for use in an equipment rack, the KMM system comprising:
   a tray subsystem comprising a pair of drawer slides configured to mate with the equipment rack, said pair of drawer slides having a bottom plane that is parallel to ground when installed in the equipment rack;
   a console housing supported by the tray subsystem, said console housing comprising a top surface, said top surface defining a keyboard recess and a monitor recess;
   a keyboard removably secured to the console housing within the keyboard recess, the keyboard positioned parallel to the bottom plane of the tray subsystem; and
   a monitor fixedly supported on and positioned at an incline in the monitor recess relative to the bottom plane of the tray subsystem so as to be viewable for use by a user, an angle of the incline is selected to minimize an overall height of the KMM system while maximizing user ergonomics.

8. The KMM system of claim 7, wherein the angle of the incline monitor is 3.5 degrees.

9. The KMM system of claim 7, wherein the drawer slides are movable between a first position, presenting the console housing to the user, and to a second position for storage within the equipment rack.

10. The KMM system of claim 7, wherein the console housing comprises a plurality of connectors along a lower rear edge portion thereof, the plurality of connectors including at least one of:
    a USB port;
    a DVI video connector;
    a VGA video connector;
    a Display port ("Dp") video connector; and
    an AC power connector port.

11. The KMM system of claim 7, further comprising a cable management system secured to the tray subsystem, for supporting cabling, the cabling adapted to be coupled to the console housing.

12. The KMM system of claim 7, further comprising at least one user accessible control on the top surface of the console housing, proximate the keyboard, when the keyboard is positioned within the keyboard recess of the console housing, enabling user control over at least one of power on/off, configuration and settings.

13. A computer rack assembly comprising:
    an equipment rack having a horizontal plane that is parallel to ground;
    a tray subsystem comprising a pair of drawer slides mated to the equipment rack;
    a console housing supported by the tray subsystem, said console housing comprising a top surface, said top surface defining a keyboard recess and a monitor recess;
    a keyboard secured to the console housing within the keyboard recess, the keyboard positioned parallel to a bottom plane of the tray subsystem; and
    a monitor fixedly supported on and positioned at an incline in the monitor recess relative to the bottom plane of the tray subsystem so as to be viewable for use by a user, an angle of the incline is selected to minimize an overall height of the computer rack assembly while maximizing user ergonomics.

14. The computer rack assembly of claim 13, wherein the angle of the incline monitor is about 3.5 degrees.

15. The computer rack assembly of claim 13, wherein the console housing is removable from the tray subsystem as a single assembly.

16. The computer rack assembly of claim 13, wherein the top surface of the console housing is positioned at a second angle, different than the angle of the incline and parallel to the ground.

17. The computer rack assembly of claim 16, wherein the keyboard is positioned parallel to the ground.

* * * * *